United States Patent [19]

Rapp

[11] 4,282,282

[45] * Aug. 4, 1981

[54] BARIUM ALUMINOSILICATE GLASSES, GLASS-CERAMICS AND DOPANT HOST

[75] Inventor: James E. Rapp, Oregon, Ohio

[73] Assignee: Owens-Illinois, Inc., Toledo, Ohio

[*] Notice: The portion of the term of this patent subsequent to Dec. 21, 1993, has been disclaimed.

[21] Appl. No.: 838,786

[22] Filed: Oct. 3, 1977

[51] Int. Cl.$^3$ .......................................... H01L 21/223
[52] U.S. Cl. .................................. 428/220; 106/39.6; 106/39.7; 106/54; 148/22; 148/186; 148/188; 148/189; 252/950; 252/951
[58] Field of Search ....................... 106/39.6, 39.7, 54; 148/188, 189, 22, 186; 252/950, 951; 428/220, 332, 426

[56] References Cited

U.S. PATENT DOCUMENTS 3,998,667 12/1976 Rapp ...................................... 148/22

Primary Examiner—Bruce H. Hess
Attorney, Agent, or Firm—Charles S. Lynch; Myron E. Click; David H. Wilson

[57] ABSTRACT

Disclosed are thermally crystallizable glass compositions, glass ceramics and dopant hosts made therefrom, wherein said dopant hosts in thin wafer form have improved resistance to warpage, said compositions containing $SiO_2$, $Al_2O_3$, MgO, BaO, and $B_2O_3$.

6 Claims, No Drawings

BARIUM ALUMINOSILICATE GLASSES, GLASS-CERAMICS AND DOPANT HOST

This invention is an improvement on the materials and products disclosed in U.S. Pat. No. 3,998,667 issued Dec. 21, 1976. The compositions disclosed and claimed in that patent encompass the compositions of the present invention, all of which are particularly useful as planar dopant hosts for vapor phase diffusion doping of semiconductor materials, such as silicon, with boron. The present compositions and products can be made and used as disclosed in said patent and the entire disclosure of said patent is incorporated herein by reference.

The present improvement is based on the discovery of a narrow range of compositions having an additional advantageous property which overcomes a problem not disclosed in said patent.

The compositions of my U.S. Pat. No. 3,998,667 (and therefore the compositions of the present invention) in the glass-ceramic state are useful in thin wafer dopant host form for the high temperature planar diffusion doping of semiconductors, especially silicon, at temperatures over 1050° C. Such glass-ceramic dopant hosts are rigid and dimensionally stable at the doping temperatures so that deformation is not a problem when the dopant source is planar in configuration. As explained in U.S. Pat. No. 3,998,667, in planar diffusion doping, a planar (i.e., generally flat) surface of a solid dopant host and a planar surface of the semiconductor to be doped are positioned parallel in spaced confronting relationship during the diffusional heat treatment. Since the concentration of $B_2O_3$ on the surface of the semiconductor is a function of the distance between the planar surfaces, dimensional stability of the dopant host is of the utmost importance in achieving uniformity in boron distribution on the surface of the silicon semiconductor.

While the compositions of my prior patent do have adequate dimensional stability at the doping temperatures disclosed after many hours of usage at such temperatures, a new problem has been discovered. Thus, it has been found that when the glass-ceramic wafers are repeatedly used for a large number of times at doping temperatures of over 1050° C. and when between the doping cycles the wafers are cooled below about 900° C., the planar wafers gradually warp until they are too far out of flat to be used for further planar doping. This condition restricts the useful life of such dopant hosts to less than their full potential based solely on the degree of exhaustion of the $B_2O_3$ contained therein.

It is an object of the invention to provide glass compositions that are thermally crystallizable to boron-containing glass-ceramic bodies that are relatively dimensionally stable to such thermal cycling even when used in thin planar form such as a round wafer 3 inches in diameter and only 0.060 inch thick.

It is a further object to provide glass-ceramic dopant hosts with improved dimensional stability and resistance to warpage when cycled between temperatures above 1050° C. and temperatures below about 900° C. repeatedly.

Other objects, features and aspects, as well as advantages, of the invention will become apparent from a study of the following description and the claims.

The solution to the aforesaid problem of warpage of the glass-ceramic planar dopant hosts after such repeated temperature cycling has been overcome by making the dopant host wafers from a glass-ceramic body formed by in situ thermal crystallization of a glass composition having a narrow composition range within the composition disclosed by my aforesaid U.S. Pat. No. 3,998,667.

According to one aspect of the present invention there are provided a glass compositions thermally crystallizable to glass-ceramic bodies, which glass compositions contain $SiO_2$, $Al_2O_3$, MgO, BaO and $B_2O_3$ in narrowly defined ratios and amounts as will be set forth in detail hereafter.

According to another aspect of the present invention there is provided a glass-ceramic body resulting from the in situ thermal crystallization of a glass of the foregoing description.

According to still another aspect of the present invention there is provided a glass-ceramic body, having a composition as set forth with respect to the foregoing glass composition, which glass-ceramic when in a dopant host wafer form having a thickness of no more than 0.1 inch, has excellent resistance to warpage when repeatedly cycled between temperatures below 900° C. and temperatures above 1050° C.

The glass compositions of the present invention, and, consequently the glass-ceramic bodies and the glass-ceramic dopant hosts of the present invention, are substantially free of alkali metal oxides, particularly $K_2O$, $Na_2O$, and $Li_2O$. By substantially alkali metal free, it is meant that the glasses do not contain sufficient of such alkali metal oxides to yield a vapor phase containing such oxides at the doping temperatures in excess of 1050° C. It has been found that the presence of such alkali metal oxides in the vapor phase contributes undesirable conductivity characteristics to the resulting semiconductor. In the usual practice of the present invention, the combined alkali metal oxides are less than about 0.5 mole percent and preferably less than 0.1 mole percent of the compositions. Preferably, the alkali metal oxides are absent altogether, although this is not always possible because batch materials often contain alkali metal oxides as impurities.

The term "glass-ceramic" body is used herein according to its conventional meaning and refers to a semicrystalline ceramic body which is composed of at least one crystalline phase randomly dispersed in a residual glassy phase or matrix. Such crystalline phase is formed by the in situ thermal crystallization of a parent glass composition.

The heat treatment process for forming glass-ceramics from a parent glass usually include a nucleation stage at substantially the temperature of the annealing point (viscosity $10^{13}$ poises) of the parent glass, a development stage at a temperature below the fiber softening point of the parent glass (preferably at a viscosity in the range of $10^8$ to $10^{12}$ poises), and a crystallization stage (at a temperature preferably 150° to 300° F. above the fiber softening point of the parent glass (i.e., viscosity of $10^{7.65}$ poises).

Although the crystallization process itself is not the subject of the present invention, the following description is given in the interest of completeness of disclosure. The parent glass to be crystallized is heated to a temperature corresponding to a viscosity of about $10^{13}$ poises and maintained at this temperature long enough to permit the formation of a submicroscopic crystals dispersed throughout a glassy matrix. This is commonly known as the nucleation. The time required for the nucleation period varies according to the composition and is typically from ¼ to 24 hours.

The glass matrix containing the nucleated crystals is then heated to a temperature corresponding to a viscosity of approximately $10^8$ poises. This thermal condition is maintained for a sufficient time to permit partial crystallization to form a rigid, crystalline structure. The submicroscopic nuclei dispersed in the glassy matrix as a result of the nucleation phase act as growth centers for the rigid framework formed during this second or development stage of the heating cycle. The development stage varies with composition and is typically ¼ to 4 hours. The purpose of the development phase is to provide a rigid skeletal-crystal framework to support the remaining matrix when the temperature is raised to complete crystallization.

The glass-ceramic body is then formed by heating to a temperature of 150° to 300° F. above the temperature corresponding to the viscosity of $10^{7.65}$ poises of the parent glass. This temperature is maintained until the desired degree of crystallinity is obtained. The final crystallization phase of the heat treating cycle is typically ¼ to 4 hours at the highest practical temperature which does not cause the glass ceramic to flow. This heat treatment promotes high temperature dimensional stability in the finished glass-ceramic. This heat treatment temperature is in the neighborhood of the solidus temperature.

In actual practice, it has been found that all three stages of the heating process can be accomplished by continuously advancing the temperature through regions of nucleation, development and crystallization. In many compositions of the present invention, it has been found that a "formal" development stage is not required because the time required to heat the article from the nucleation temperature to the crystallization temperature is sufficient. Additional details for forming glass-ceramic bodies are described in U.S. Pat. No. 3,117,881, the disclosure of which is incorporated by reference.

In practicing the present invention, the glass-ceramic dopant host is formed from a magnesium barium aluminoborosilicate parent glass which is substantially free of alkali metal oxides and consists essentially of the following components on a mole percent basis:

| Component | Mole Percent |
| --- | --- |
| $SiO_2$ | 45–52 |
| $Al_2O_3$ | 18.5–22.5 |
| $B_2O_3$ | 20–25 |
| MgO | 2.5–4.5 |
| BaO | 3.5–5.5 | with the following molar ratios:
$SiO_2/Al_2O_3 > 2.1$
$SiO_2/B_2O_3 < 2.3$
$Al_2O_3/RO\ 2.1–3.1$
Usually the sum total of alkali metal oxides is less than 0.5 mole percent and preferably less than 0.1 mole percent in the above compositions.

The foregoing range of glass and glass-ceramic compositions has been found to be superior in several ways to the broad range of compositions disclosed in my U.S. Pat. No. 3,998,667. First, the compositions have superior warpage resistance on repeated cycling of thin wafers between about 900° and over 1050° C. This is in large part due to the narrow recited range of the components, notably the $B_2O_3$ range from 20 to 25 percent and the range of ratios $Al_2O_3$ to MgO plus BaO from 2.1 to 3.1. Also, when the $SiO_2$ is too high or too low, or when the $SiO_2/B_2O_3$ ratio is too high, or the $SiO_2/Al_2O_3$ ratio is too low, the glass compositions are more difficult to cast without encountering undesired premature crystallization or phase separation.

In the present specification and the claims the term "consisting essentially of" or "consists essentially of" is intended to allow the inclusion of minor portions of inorganic oxide components other than alkali metal oxides that are not deterimental to the semiconductor doping and do not adversely affect the warpage resistance of the composition in the form of glass-ceramic dopant host wafers when thermally cycled as described herein.

Exemplary use of the glass-ceramic dopant hosts of the present invention are described in my U.S. Pat. No. 3,998,667 from column 6, line 8 through all of column 7, as well as in column 8, lines 41–68 and column 9, line 50 to column 10, line 4. However, within the temperature range there specified, the present dopant hosts find their greatest usefulness when used for doping at temperatures above 1050° C. and, although the compositions of the present invention can be used for doping germanium, the present compositions are not now preferred for such use since the doping has to be carried out below 937° C., at which temperatures warpage of the wafers of the broad composition range disclosed in my U.S. Pat. No. 3,998,667 is usually minimal.

In preparing the glass-ceramic bodies of the present invention, suitable compositions containing appropriate raw materials can be melted to form a homogeneous glass. Illustratively, compositions described above can be melted to form a homogeneous glass at 1500° to 1650° C. in a refractory vessel. Generally, this melting procedure requires about 15 minutes to several hours to achieve homogeneity. It can be desirable to add additional $B_2O_3$ to the melt to account for losses due to volatilization. It is also desirable to keep the melting time as short as possible in order to reduce the losses due to volatilization. Furthermore, the batch materials should be as pure as possible so as to minimize the presence of impurities in the resulting glass and the glass-ceramic body.

The dopant host can be produced in a number of ways. The parent glass can be melted from metal-organic derived materials to minimize the content of undesirable impurities, as is disclosed in commonly assigned U.S. Pat. No. 3,640,093, the disclosure of which is incorporated by reference, or it can be melted from conventional high purity glassmaking ingredients.

As is well known, the presence of impurities can deleteriously affect the electrical performance of the doped silicon semiconductor device. Impurities specifically to be excluded or held at an absolute minimum are the oxides of the alkalis, i.e., $Li_2O$, $Na_2O$, $K_2O$, $Cs_2O$, or $Rb_2O$ and other high vapor pressure components such as PbO, $SnO_2$, and CuO.

After the glass compositions are melted and formed into a homogeneous molten mass, the glass can be cast into any desired shape. Conveniently, this can be carried out by casting the glass into preheated graphite molds in the shape of right circular cylinders of a diameter approximating that of the finished diffusion disc. The glass can be permitted to cool and when cold the glass billet or cylinder is removed and inspected for flaws and then sliced into wafers usually ranging from 0.025 to 0.100 inches in thickness. At this point, the glass wafers are in a form for conversion to a glass-ceramic. Alternatively, the glass billet or a core drilled cylindrical section can be heat treated to form the glass-ceramic, which glass-ceramic is then sliced into wafers of such thickness. Because of the very close control made possible by the present invention, a plurality of silicon elements can be treated by appropriate positioning of a plurality of glass-ceramic wafers arranged in a boat described in said U.S. Pat. No. 3,998,667.

EXAMPLE I

In a specific example of the invention the following batch components were melted:

|  | Parts by Weight |
|---|---|
| Quartz[1] | 1825.1256 |
| Alumina[2] | 1392.1638 |
| Boric Acid[3] | 2053.1018 |
| Magnesium oxide[4] | 103.6125 |
| Barium carbonate[5] | 671.0065 |

[1]$SiO_2$ 99.98%, $Al_2O_3$ 0.0064%, $Fe_2O_3$ 0.0004%, $Na_2O$ 0.0014%, $K_2O$ 0.0005%, $Li_2O$ 0.0006%
[2]$Al_2O_3$ 99.98%, $Na_2O$ 0.0020%, $K_2O$ 0.0010%, $Li_2O$ 0.0005%
[3]BaO 77.62%, $Fe_2O_3$ 0.0004%, balance ignition loss, mainly $CO_2$
[4]MgO 99.5%, $Fe_2O_3$ 0.0010%, $Na_2O$ 0.0003%, $Li_2O$ 0.0003%
[5]$B_2O_3$ 56.4300%, $Fe_2O_3$ 0.0001%, balance water In calculating the batch component weights excess $B_2O_3$ was added to account for evaporation losses, as was similarly done with the other examples shown in Table I.

The batch components were mixed and the batch was melted in platinum in an electric furnace at 3000° F., in air for six hours, with mechanical stirring for about 1.75 hours of that time. The molten glass was cast into a cylindrical billet 3.25 inches in diameter.

TABLE I

| Component | 1 | 2 | 3 | 4 | 5 | 6 | 7 | 8 | 9 | 10 |
|---|---|---|---|---|---|---|---|---|---|---|
| $SiO_2$ | 46.32 | 45.61 | 47.4 | 46.6 | 49.3 | 51.0 | 46.6 | 42.5 | 54.0 | 49.0 |
| $Al_2O_3$ | 20.95 | 20.90 | 22.1 | 21.6 | 20.4 | 19.1 | 22.4 | 21.4 | 20.4 | 19.1 |
| MgO | 3.73 | 3.77 | 3.74 | 4.18 | 2.96 | 2.75 | 3.27 | 3.69 | 2.19 | 2.76 |
| BaO | 5.21 | 5.12 | 4.85 | 4.18 | 3.88 | 3.68 | 4.32 | 4.75 | 2.91 | 3.67 |
| $B_2O_3$ | 23.78 | 24.60 | 22.0 | 23.5 | 23.5 | 23.5 | 23.5 | 30.3 | 20.5 | 25.5 |
| Warpage | 0.5 | 1.2 | 1 | 1.2 | 0.9 | 0.5 |  | 1.9 | 1.7 | 2.3 |

Analysis of the glass is shown in composition 1 in Table I. All figures in Table I are in mole percent.

After annealing for three hours at 1250° F., the glass billet was thermally in situ crystallized to a glass-ceramic body using the following heat treatment schedule:
Heated to 1325° F. at 216° F./hr.
Held at 1325° F. for 16 hours
Heated to 1800° F. at 98° F./hr.
Heated to 2100° F. at 39° F./hr.
Held at 2100° F. for 2 hours
Cooled to 1500° F. at 39° F./hr.
Cooled to room temperature at furnace rate.

The resulting glass-ceramic body was sliced into 3 inch diameter wafers each 60 mils thick. These wafers were placed in multislotted fused silica trays alternated with silicon wafers, as is described in U.S. Pat. No. 3,998,667 in connection with FIG. 3 therein, except that only one silicon wafer was placed between two glass-ceramic wafers. The assembly was then slowly heated to about 1100° C., held there for a few moments, cooled to below 900° C., held there a few minutes and then the heating and cooling repeated for 30 cycles. Then the warpage or 'out of flat' was measured by placing the wafer on the flat table of a dial comparator thickness gauge and measuring the amount that the height above the table exceeds the thickness. This was repeated for the reverse side of the wafer. It was arbitrarily decided in such tests to add together the two warpage figures. The total warpage for all cycles for each wafer was divided by the number of cycles. This was repeated for a number of wafers of composition 1, and the average warpage so determined for composition 1 is reported in Table I in mils per cycle.

The glass compositions of the invention are thermally crystallizable to glass-ceramic bodies that exhibit warpage of less than 1.5 mils per cycle after such repeated cycling from below 900° C. to over 1050° C. when in the form of dopant host wafers 3 inches in diameter and 60 mils thick.

EXAMPLES 2–10

In Table I are shown the compositions of other glass-ceramic bodies formed into 0.060 inch thick, 3 inch diameter dopant host wafers. These were made from glasses having the compositions shown in a manner similar to Example I except that the crystallization heat treatment schedule used was as follows:
Heated to 1325° F. at 216° F./hr.
Held at 1325° F. for 16 hours
Heated to 2100° F. in 2 hours
Held at 2100° F. for 2 hours
Cooled to room temperature Examples 1–6 show exemplary compositions of the present invention, while examples 7–10 show compositions which are outside the invention. The warpage figures were determined and reported in the same manner in examples 2–10 as has been described in connection with Example 1. Example 7 was relatively unstable as a glass and tended to devitrify prematurely on casting as a glass.

As will be evident to those skilled in the art, various modifications of this invention can be made or followed in the light of the foregoing disclosure and discussion without departing from the spirit and scope of the disclosure or from the scope of the claims.

I claim:
1. A glass thermally crystallizable to a glass-ceramic body, which glass is substantially free of alkai metal oxides and consists essentially of, in mole percent:

| Component | Mole Percent |
|---|---|
| $SiO_2$ | 45–52 |
| $Al_2O_3$ | 18.5–22.5 |
| $B_2O_3$ | 20–25 |
| MgO | 2.5–4.5 |
| BaO | 3.5–5.5 | with the following molar ratios:
$SiO_2/Al_2O_3 > 2.1$
$SiO_2/B_2O_3 < 2.3$
$Al_2O_3/(MgO+BaO)$ 2.1–3.1

2. A glass of claim 1 wherein the sum total of alkali metal oxides is less than 0.1 mole percent.

3. A glass-ceramic body resulting from the thermal in situ crystallization of a glass of claim 1.

4. A glass-ceramic body resulting from the thermal in situ crystallization of a glass of claim 2.

5. A glass ceramic body of claim 3 which is a dopant host in wafer form having a thickness of no more than 0.1 inch, said dopant host having excellent resistance to warpage when repeatedly cycled between temperatures below 900° C. and temperatures above 1050° C.

6. A glass-ceramic body of claim 4 which is a dopant host in wafer form having a thickness of no more than 0.1 inch, said dopant host having excellent resistance to warpage when repeatedly cycled between temperatures below 900° C. and temperatures above 1050° C.

* * * * *

UNITED STATES PATENT AND TRADEMARK OFFICE
CERTIFICATE OF CORRECTION

PATENT NO. : 4,282,282

DATED : August 4, 1981

INVENTOR(S) : James E. Rapp

It is certified that error appears in the above-identified patent and that said Letters Patent are hereby corrected as shown below:

Please change the fourth entry in the title page to read as follows:

* Notice: The portion of the term of this patent subsequent to Sept. 23, 1992, has been disclaimed.

Signed and Sealed this

Fifteenth Day of June 1982

[SEAL]

Attest:

GERALD J. MOSSINGHOFF

Attesting Officer

Commissioner of Patents and Trademarks